(12) United States Patent
Kang et al.

(10) Patent No.: US 12,236,043 B2
(45) Date of Patent: Feb. 25, 2025

(54) ELECTRONIC DEVICE WITH IMPROVED SENSING PERFORMANCE

(71) Applicant: Samsung Display Co., Ltd., Yongin-si (KR)

(72) Inventors: Jina Kang, Yongin-si (KR); Sanghyun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/450,245

(22) Filed: Aug. 15, 2023

(65) Prior Publication Data

US 2024/0094849 A1 Mar. 21, 2024

(30) Foreign Application Priority Data

Sep. 19, 2022 (KR) ........................ 10-2022-0117706

(51) Int. Cl.

| G06F 3/041 | (2006.01) |
|---|---|
| G06F 3/0354 | (2013.01) |
| G06F 3/044 | (2006.01) |
| H04W 4/80 | (2018.01) |
| H10K 50/844 | (2023.01) |
| H10K 59/40 | (2023.01) |

(52) U.S. Cl.
CPC ...... *G06F 3/04184* (2019.05); *G06F 3/04162* (2019.05); *G06F 3/03545* (2013.01); *G06F 3/0416* (2013.01); *G06F 3/0442* (2019.05); *H04W 4/80* (2018.02); *H10K 50/844* (2023.02); *H10K 59/40* (2023.02)

(58) Field of Classification Search
CPC ............. G06F 3/04184; G06F 3/04162; G06F 3/03545; G06F 3/0416; G06F 3/0442; H10K 50/844; H10K 59/40; H04W 4/80
See application file for complete search history.

(56) References Cited

U.S. PATENT DOCUMENTS

| 10,324,547 | B2 | 6/2019 | Han et al. | |
|---|---|---|---|---|
| 10,474,280 | B2 | 11/2019 | Jang et al. | |
| 10,761,619 | B2 | 9/2020 | Park | |
| 11,307,703 | B2 | 4/2022 | Liang | |
| 11,836,318 | B1 * | 12/2023 | Siaw | ..................... G06F 3/0441 |
| 2017/0285771 | A1 * | 10/2017 | Jung | ..................... G06F 3/0383 |
| 2020/0004367 | A1 * | 1/2020 | Lee | ..................... G06F 3/03545 |
| 2022/0011916 | A1 * | 1/2022 | Chen | ..................... G06F 3/04162 |
| 2023/0161425 | A1 * | 5/2023 | Chen | ..................... G06F 3/03545 345/179 |

FOREIGN PATENT DOCUMENTS

| KR | 10-2017-0081128 A | 7/2017 |
|---|---|---|
| KR | 10-2018-0079586 A | 7/2018 |

* cited by examiner

*Primary Examiner* — Adam J Snyder
(74) *Attorney, Agent, or Firm* — Lewis Roca Rothgerber Christie LLP

(57) ABSTRACT

An electronic device, includes: a display device configured to display an image; and an input device configured to communicate with the display device, wherein the display device includes: a display panel including a plurality of pixels; an input sensor on the display panel; a panel driver configured to control the display panel; a main controller configured to provide a control signal to the panel driver; and a sensor controller configured to control the input sensor, wherein the display device is configured to transmit a sync signal included in the control signal to the input device.

18 Claims, 13 Drawing Sheets

ELECTRONIC DEVICE WITH IMPROVED SENSING PERFORMANCE

CROSS-REFERENCE TO RELATED APPLICATIONS

The present application claims priority to and the benefit of Korean Patent Application No. 10-2022-0117706 filed on Sep. 19, 2022, in the Korean Intellectual Property Office, the entire disclosure of which is incorporated herein by reference.

BACKGROUND

Aspects of some embodiments of the present disclosure described herein relate to an electronic device, and for example, to an electronic device with relatively improved sensing performance.

Various multimedia electronic devices, such as a television, a portable phone, a tablet computer, a navigation system, and a game console, include a display device for displaying an image. Other than a general input scheme such as a button, a keyboard, a mouse, or the like, the display device may include an input sensor capable of providing a touch-based input scheme which allows a user to relatively easily enter information or commands intuitively and conveniently.

The input sensor may sense touch or pressure using the body (e.g., a finger) of the user. Meanwhile, there is an increasing demand for employing a pen for a fine touch input for a user who is accustomed to entering information using writing instruments or for a specific application program (e.g. an application program for sketching or drawing). The display device may detect an external input applied from the outside of the display device. The external input may be an input of the user using an input device (e.g., an electronic pen or the like).

The above information disclosed in this Background section is only for enhancement of understanding of the background and therefore the information discussed in this Background section does not necessarily constitute prior art.

SUMMARY

Aspects of some embodiments of the present disclosure include an electronic device for enhancing a phenomenon in which sensing performance of a signal provided from an input device is degraded due to display noise.

According to some embodiments, an electronic device may include a display device that displays an image and an input device that communicates with the display device.

According to some embodiments, the display device may include a display panel including a plurality of pixels, an input sensor on the display panel, a panel driver that controls the display panel, a main controller that provides a control signal to the panel driver, and a sensor controller that controls the input sensor. According to some embodiments, the display device may transmit a sync signal included in the control signal to the input device.

According to some embodiments, an electronic device, includes: a display device configured to display an image; and an input device configured to communicate with the display device, wherein the display device includes: a display panel including a plurality of pixels; an input sensor on the display panel; a panel driver configured to control the display panel; a main controller configured to provide a control signal to the panel driver; and a sensor controller configured to control the input sensor, wherein the display device is configured to transmit a sync signal included in the control signal to the input device.

According to some embodiments, the main controller is configured to transmit the sync signal to the input device.

According to some embodiments, the sensor controller is configured to receive the sync signal from the main controller and to transmit the received sync signal to the input device.

According to some embodiments, the control signal includes: a vertical sync signal for determining a frame period where the image is displayed; and a horizontal sync signal for determining a time point when data is written in the plurality of pixels, and wherein the sync signal includes the horizontal sync signal.

According to some embodiments, the input sensor is configured to operate in a first mode for detecting a first input by an input device or to operate in a second mode for detecting a second input different from the first input.

According to some embodiments, the input device includes: a first communication module configured to receive an uplink signal from the input sensor in the first mode and to transmit a compensation downlink signal to the input sensor; and a second communication module configured to receive the sync signal.

According to some embodiments, the second communication module is configured to communicate with the display device over a short range communication network.

According to some embodiments, the input device further includes: a pen controller connected with the first communication module and the second communication module, and wherein the pen controller includes: a pen signal generator configured to generate a downlink signal; a delay signal generator configured to generate a delay signal based on the sync signal; and a pen signal compensator configured to generate the compensation downlink signal based on the delay signal and the downlink signal, and wherein a delay activation period of the delay signal does not overlap an activation period of the sync signal.

According to some embodiments, the delay activation period is initiated at a time point delayed by a predetermined reference time from a start time point of the activation period of the sync signal.

According to some embodiments, the sync signal further includes a blank period, and a driving period of the compensation downlink signal is generated within the delay activation period of the delay signal to overlap the blank period of the sync signal.

According to some embodiments, the reference time varies with a driving frequency of the display device.

According to some embodiments, each of the downlink signal and the compensation downlink signal have a square wave.

According to some embodiments, the input device further includes: a pen controller connected with the first communication module and the second communication module, and wherein the pen controller includes: a pen signal generator configured to generate a downlink signal; a masking signal generator configured to generate a masking signal based on the sync signal; and a pen signal compensator configured to generate the compensation downlink signal based on the masking signal and the downlink signal.

According to some embodiments, a masking period of the masking signal overlap an activation period of the sync signal.

According to some embodiments, the masking period is set to a period from a start time point of the activation period of the sync signal to a predetermined reference time point, and wherein a falling edge and a rising edge of the compensation downlink signal do not overlap the activation period.

According to some embodiments, the masking period is greater in duration than the activation period.

According to some embodiments, the second communication module is configured to transmit delay information of the compensation downlink signal to the sensor controller.

According to some embodiments, the input sensor includes: first sensing electrodes and second sensing electrodes crossing the first sensing electrodes to be insulated from the first sensing electrodes.

According to some embodiments, the display panel includes: a light emitting element layer including a light emitting element; and an encapsulation layer on the light emitting element layer.

According to some embodiments, the input sensor is directly on the encapsulation layer.

BRIEF DESCRIPTION OF THE FIGURES

The above and other characteristics and features of the present disclosure will become more apparent by describing in more detail aspects of some embodiments thereof with reference to the accompanying drawings.

DETAILED DESCRIPTION

Figure 1:
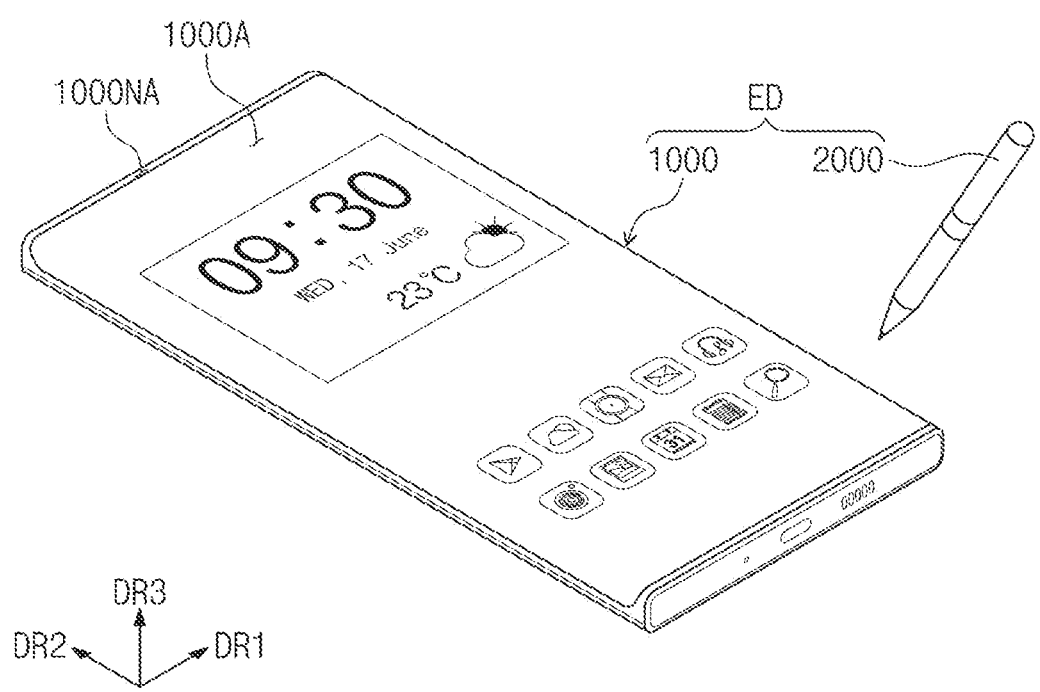
FIGS. 1 and 2 are perspective views illustrating electronic devices according to embodiments of the present disclosure.

In the specification, the expression that a first component (or area, layer, part, portion, etc.) is "on", "connected with", or "coupled to" a second component means that the first component is directly on, connected with, or coupled to the second component or means that a third component is interposed therebetween.

Like reference numerals refer to like elements. Also, in the drawings, the thicknesses, the ratios, and the dimensions of the components may be exaggerated for effective description of technical contents. The expression "and/or" includes one or more combinations capable of being defined by associated components.

Although the terms "first," "second," etc. may be used herein in describing various components, such components should not be construed as being limited by these terms. These terms are only used to distinguish one component from another component. For example, a first component could be termed a second component without departing from the scope of the claims of the present disclosure, and similarly a second component could be termed a first component. The articles "a," "an," and "the" are singular in that they have a single referent, but the use of the singular form in the specification should not preclude the presence of more than one referent.

Also, the terms "under", "below", "on", "above", etc. are used to describe the correlation of components illustrated in drawings. These terms are relative concepts and are described on the basis of the directions shown in the drawings.

It will be further understood that the terms "comprises", "includes", "have", etc. specify the presence of stated features, numbers, steps, operations, components, parts, or a combination thereof, but do not preclude the presence or addition of one or more other features, numbers, steps, operations, components, parts, or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, aspects of some embodiments of the present disclosure will be described with reference to the accompanying drawings.

FIG. 1 is a perspective view illustrating an electronic device according to some embodiments of the present disclosure.

Referring to FIG. 1, an electronic device ED may include a display device 1000 and an input device 2000. The display device 1000 may be a device activated depending on an electrical signal. For example, the display device 1000 may be, but is not limited to, a mobile phone, a tablet, a car navigation system, a game console, or a wearable device. For purposes of illustration, FIG. 1 illustrates that the display device 1000 is a mobile phone, but embodiments according to the present disclosure are not limited thereto.

An active area 1000A and a non-active area 1000NA may be defined in the display device 1000. The display device 1000 may display images at the active area 1000A. The active area 1000A may include a surface defined by a first direction DR1 and a second direction DR2. The non-active area 1000NA may surround the active area 1000A.

The thickness direction of the display device 1000 may be parallel to a third direction DR3 crossing the first direction DR1 and the second direction DR2. Thus, front surfaces (or upper surfaces) and rear surfaces (or lower surfaces) of members making up the display device 1000 may be defined with respect to the third direction DR3.

The display device 1000 may detect inputs applied from the outside of the display device 1000. The inputs may include various types of external inputs such as a part of the body of a user, light, heat, or pressure.

The display device 1000 illustrated in FIG. 1 may detect an input by a touch of the user and an input by the input device 2000. The input device 2000 may refer to a device except for the body of the user. The input by the input device 2000 may be referred to as a first input, and the input by the touch of the user may be referred to as a second input. For example, the input device 2000 may be an active pen, a stylus pen, a touch pen, or an electronic pen. Hereinafter, the case where the input device 2000 is the active pen will be described as an example.

The display device 1000 and the input device 2000 may perform bidirectional communication. The display device 1000 may provide an uplink signal to the input device 2000. For example, the uplink signal may include, but is not particularly limited to, a synchronization signal or information of the display device 1000. The input device 2000 may provide a compensation downlink signal to the display device 1000. The compensation downlink signal may include a synchronization signal or state information of the input device 2000. For example, the compensation downlink signal may include, but is not particularly limited to, coordinate information of the input device 2000, battery information of the input device 2000, slope information of the input device 2000, various pieces of information stored in the input device 2000, and/or the like. The uplink signal and the compensation downlink signal will be described below.

Figure 2:
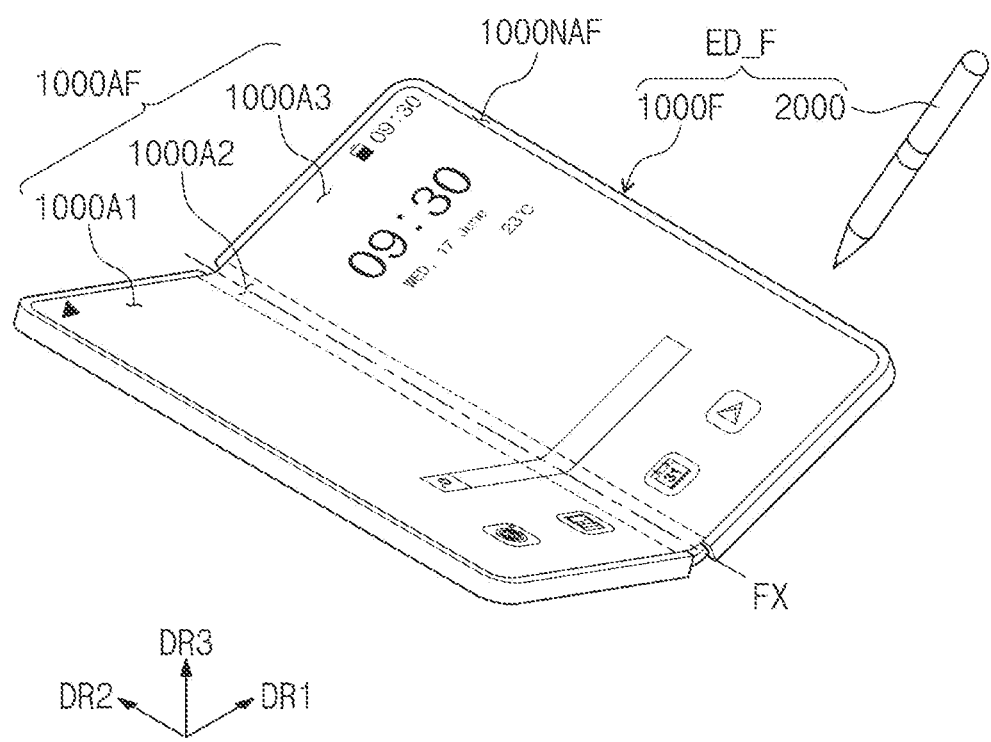

FIG. 2 is a perspective view illustrating an electronic device according to some embodiments of the present disclosure. In describing FIG. 2, the same reference numerals are assigned to the components described with reference to FIG. 1, and thus some description thereof may be omitted.

Referring to FIG. 2, an electronic device ED_F according to some embodiments of the present disclosure may include a display device 1000F and an input device 2000. The display device 1000F may display an image on an active area 1000AF. FIG. 2 illustrates that the display device 1000F is folded at a certain angle. In a state where the display device 1000F is unfolded, the active area 1000AF may include a plane defined by a first direction DR1 and a second direction DR2. The display device 1000F may further include a non-active area 1000NAF adjacent to the active area 1000AF.

The active area 1000AF may include a first active area 1000A1, a second active area 1000A2, and a third active area 1000A3. The first active area 1000A1, the second active area 1000A2, and the third active area 1000A3 may be sequentially defined in the first direction DR1. The second active area 1000A2 may be bent about a folding axis FX extending along the second direction DR2. Thus, the first active area 1000A1 and the third active area 1000A3 may be referred to as non-folding areas, and the second active area 1000A2 may be referred to as a folding area.

When the display device 1000F is folded, the first active area 1000A1 and the third active area 1000A3 may face each other. Thus, in a state where the display device 1000F is fully folded, the active area 1000AF may not be exposed to the outside, which may be referred to as "in-folding". However, the example embodiments are merely illustrative and the operation of the display device 1000F is not limited thereto.

For example, according to some embodiments of the present disclosure, when the display device 1000F is folded, the first active area 1000A1 and the third active area 1000A3 may oppose each other. Thus, in a state where the display device 1000F is folded, the active area 1000AF may be exposed to the outside, which may be referred to as "out-folding".

The display device 1000F may perform only one of an in-folding operation or an out-folding operation. Alternatively, the display device 1000F may perform both the in-folding operation and the out-folding operation. In this case, the same area of the display device 1000F, for example, the second active area 1000A2 may be folded inwardly and outwardly.

One folding area and two non-folding areas are illustrated as an example in FIG. 2, but the number of folding areas and the number of non-folding areas are not limited thereto. For example, the display device 1000F may include a plurality of non-folding areas, which are greater in number than two, and a plurality of folding areas arranged between the non-folding areas adjacent to one another.

The case where the folding axis FX extends in the second direction DR2 is illustrated as an example, but embodiments according to the present disclosure are not limited thereto. For example, the folding axis FX may extend in a direction parallel to the first direction DR1. In this case, the first active area 1000A1, the second active area 1000A2, and the third active area 1000A3 may be sequentially arranged along the second direction DR2.

The active area 1000AF may overlap at least one electronic module. For example, the at least one electronic module may include a camera module, a proximity illumination sensor, and the like. The at least one electronic module may receive an external input delivered through the active area 1000AF or may provide an output through the active area 1000AF. A portion of the active area 1000AF overlapping the camera module, the proximity illumination sensor, and the like may have transmissivity higher than another portion of the active area 1000AF. Thus, an area where a plurality of electronic modules will be arranged is not provided to the non-active area 1000NAF. As a result, the ratio of the area of the active area 1000AF to the front surface of the display device 1000F may increase, and the ratio of the area of the non-active area 1000NAF to the front surface of the display device 1000F may decrease.

The display device 1000F and the input device 2000 may perform bidirectional communication. The display device 1000F may provide an uplink signal to the input device 2000. The input device 2000 may provide a compensation downlink signal to the display device 1000F. The display device 1000F may detect coordinates of the input device 2000 using the signal provided from the input device 2000.

Figure 3:
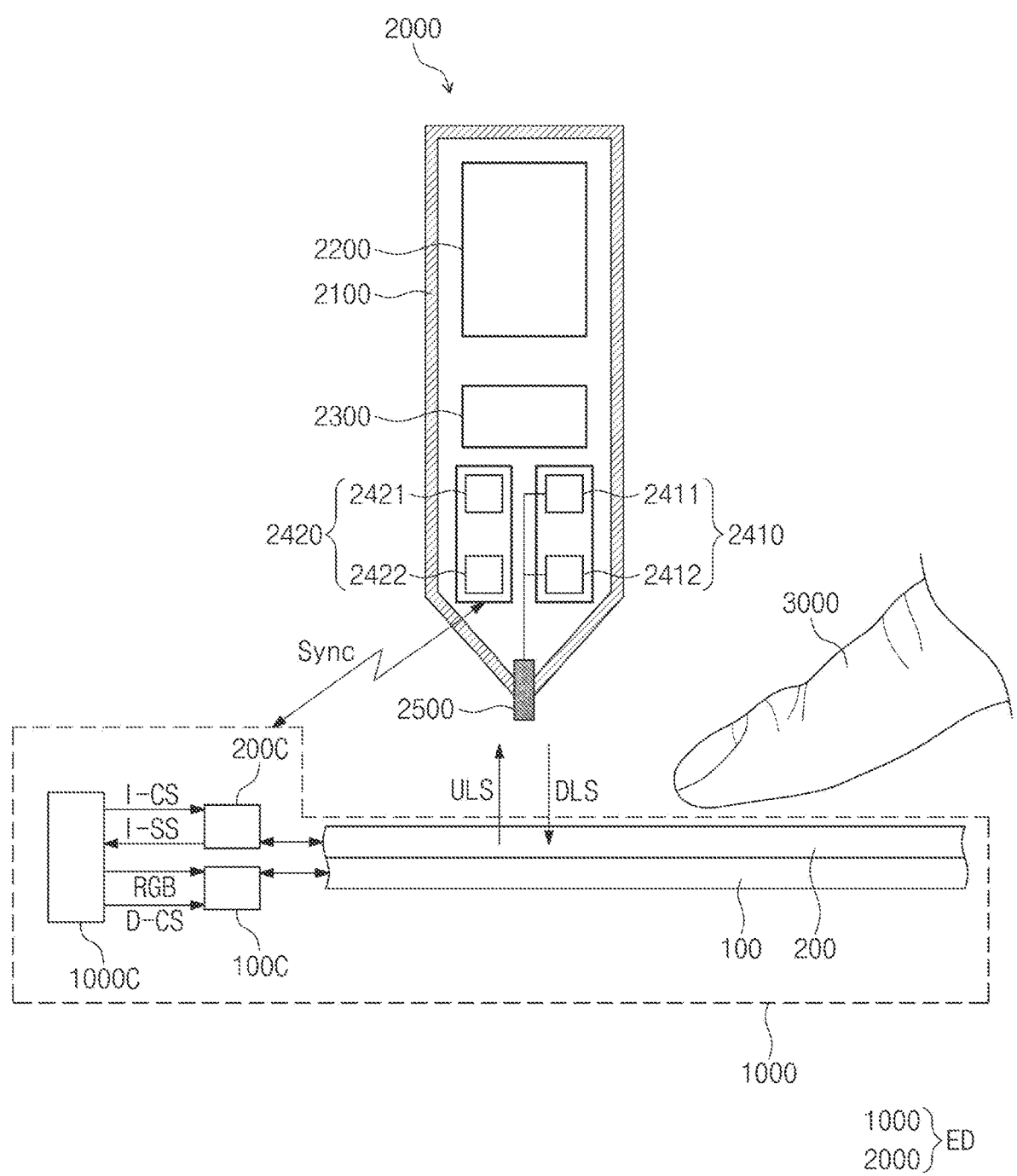
FIG. 3 is a block diagram schematically illustrating a display device and an input device according to some embodiments of the present disclosure.

FIG. 3 is a block diagram schematically illustrating a display device and an input device according to some embodiments of the present disclosure.

Referring to FIG. 3, a display device 1000 may include a display panel 100, an input sensor 200, a panel driver 100C, a sensor controller 200C, and a main controller 1000C.

The display panel 100 may be a component which substantially generates or displays images. The display panel 100 may be a light emitting display panel. For example, the display panel 100 may be an organic light emitting display panel, an inorganic light emitting display panel, a quantum dot display panel, a micro-LED display panel, or a nano-LED display panel.

The input sensor 200 may be located on the display panel 100. The input sensor 200 may sense an external input applied from the outside. The input sensor 200 may sense a first input by the input device 2000 and a second input different from the first input (i.e., by a body 3000 of the user).

The main controller 1000C may control the overall operation of the display device 1000. For example, the main controller 1000C may control operations of the panel driver 100C and the sensor controller 200C. The main controller 1000C may include at least one microprocessor, and the main controller 1000C may be referred to as a host.

The panel driver 100C may control the display panel 100. The main controller 1000C may further include a graphics controller. The panel driver 100C may receive an image signal RGB and a first control signal D-CS from the main controller 1000C. The first control signal D-CS may include various signals. For example, the first control signal D-CS may include a vertical sync signal, a horizontal sync signal, a main clock, a data enable signal, and the like. The vertical sync signal may be a signal for determining a frame period in which an image displayed. The horizontal sync signal may be a signal for determining a period in which a data signal is written in a pixel PX (refer to FIG. 7). The panel driver 100C may generate various control signals (e.g., a start signal and a clock signal) for controlling timing for providing a signal to the display panel 100 based on the first control signal D-CS.

The sensor controller 200C may control the input sensor 200. The sensor controller 200C may receive a second control signal I-CS from the main controller 1000C. The second control signal I-CS may include a mode determination signal for determining a driving mode of the sensor controller 200C and a clock signal. The sensor controller 200C may operate in a first mode for detecting the first input by the input device 2000 based on the second control signal I-CS or a second mode for detecting the second input by the body 3000 of the user. The sensor controller 200C may control the input sensor 200 in the first mode or the second mode, which will be described in more detail below, based on the mode determination signal.

The sensor controller 200C may calculate coordinate information of the first input or the second input based on the signal received from the input sensor 200 and may provide the main controller 1000C with a coordinate signal I-SS having the coordinate information. The main controller 1000C may execute an operation corresponding to the user input based on the coordinate signal I-SS. For example, the main controller 1000C may operate the panel driver 100C such that a new application image is displayed on the display panel 100 based on the coordinate signal I-SS.

The input device 2000 may include a housing 2100, a power source 2200, a pen controller 2300, a first communication module (or a first communication circuit) 2410, a second communication module (or a second communication circuit) 2420, a tip electrode (or a pen electrode) 2500. However, the components making up the input device 2000 are not limited to the listed components. For example, the input device 2000 may further include an electrode switch for switching to a signal transmission mode or a signal reception mode, a pressure sensor for sensing pressure, a memory for storing certain information, a rotation sensor for sensing rotation, or the like.

The housing 2100 may have a pen shape, and a receiving space may be formed in the housing 2100. The power source 2200, the pen controller 2300, the first communication module 2410, the second communication module 2420, and the pen electrode 2500 may be received in the receiving space defined in the housing 2100.

The power source 2200 may supply power to the pen controller 2300, the first communication module 2410, the second communication module 2420, or the like in the input device 2000. The power source 2200 may include a battery or a high capacity capacitor.

The pen controller 2300 may control an operation of the input device 2000. The pen controller 2300 may be an application-specific integrated circuit (ASIC). The pen controller 2300 may be configured to operate according to a designed program.

The first communication module 2410 may include a first receive circuit 2411 and a first transmit circuit 2412. The first receive circuit 2411 may receive an uplink signal ULS provided from the input sensor 200. The first transmit circuit 2412 may output a compensation downlink signal DLS_a to the input sensor 200. The first receive circuit 2411 may modulate the signal provided from the input sensor 200 into a signal capable of being processed by the pen controller 2300. The first transmit circuit 2412 may receive the signal provided from the pen controller 2300 and may modulate the received signal into a signal capable of being sensed by the input sensor 200.

The second communication module 2420 may include a second receive circuit 2421 and a second transmit circuit 2422. The second receive circuit 2421 may receive a sync signal Sync from the main controller 1000C or the sensor controller 200C. The second receive circuit 2421 may provide the pen controller 2300 with the received sync signal Sync. The pen controller 2300 may determine a driving time point (or a delay time point) of the compensation downlink signal DLS_a based on the sync signal Sync. The second transmit circuit 2422 may transmit delay information of the compensation downlink signal DLS_a, provided from the pen controller 2300, to the main controller 1000C or the sensor controller 200C.

The pen electrode 2500 may be electrically connected with the first communication module 2410. A part of the pen electrode 2500 may protrude from the housing 2100. Alternatively, the input device 2000 may further include a cover housing which covers the pen electrode 2500 exposed from the housing 2100. Alternatively, the pen electrode 2500 may be embedded in the housing 2100.

The input device 2000 may further include a receive electrode which receives the uplink signal ULS and a transmit electrode which transmits the compensation downlink signal DLS_a, other than the pen electrode 2500. As such, when the input device 2000 separately has the receive electrode and the transmit electrode, sensing performance of the input device 2000 may be more improved.

Figure 4A:
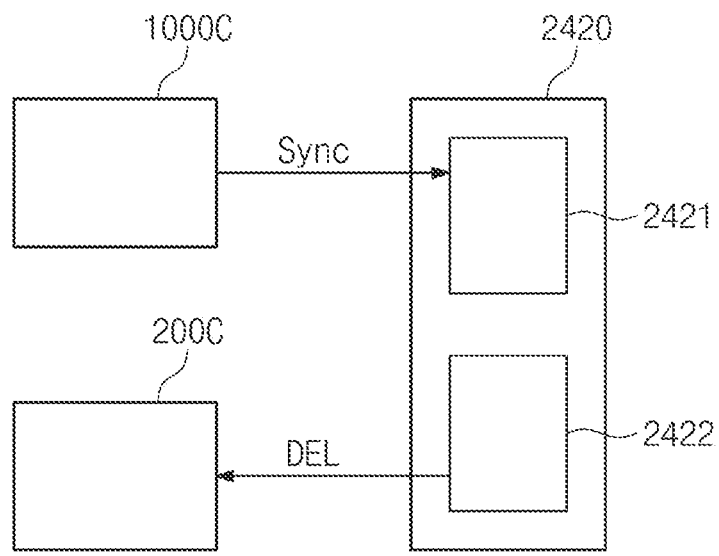
FIGS. 4A and 4B are block diagrams illustrating signal flow between a display device and a second communication module of an input device according to embodiments of the present disclosure.
Figure 4B:
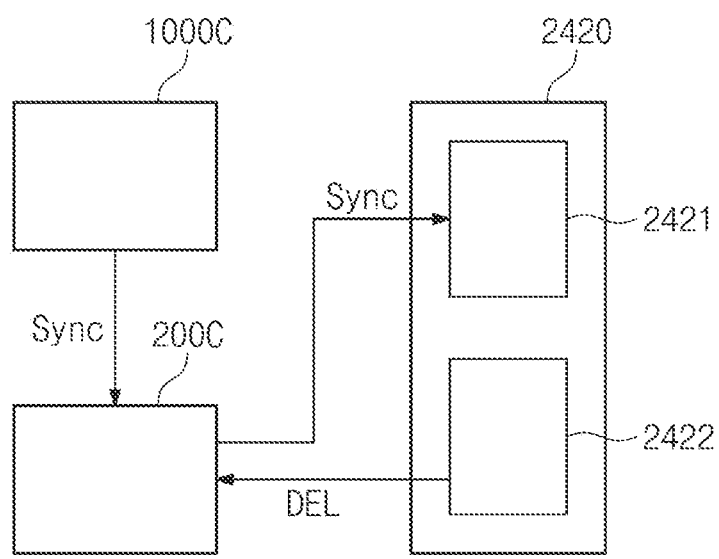

FIGS. 4A and 4B are block diagrams illustrating signal flow between a display device and a second communication module of an input device according to some embodiments of the present disclosure.

Referring to FIGS. 3 and 4A, the main controller 1000C may transmit the sync signal Sync to the input device 2000. For example, the main controller 1000C may transmit the sync signal Sync to the second communication module 2420 of the input device 2000. The sync signal Sync may be a horizontal sync signal. The second communication module 2420 may include a wireless communication module (e.g., a cellular communication module, a short range wireless communication module, a global navigation satellite system (GNSS) communication module, or the like). The second communication module 2420 may communicate with the display device 1000 (for example, the main controller 1000C) over a short range communication network (e.g., Bluetooth, wireless-fidelity (Wi-Fi) Direct, infrared data association (IrDA), or the like).

The main controller 1000C may transmit the sync signal Sync to a second receive circuit 2421 of the second communication module 2420. The second receive circuit 2421 may transmit the received sync signal Sync to the pen controller 2300. The pen controller 2300 may generate a delay signal DEL based on the sync signal Sync. The configuration of the pen controller 2300 will be described below with reference to FIGS. 10A and 11A.

The delay signal DEL generated from the pen controller 2300 may be transmitted to the sensor controller 200C through the second communication module 2420. The sensor controller 200C may receive the delay signal DEL from a second transmit circuit 2422 of the second communication module 2420. The sensor controller 200C may identify delay information of the compensation downlink signal DLS_a in advance by means of the delay signal DEL.

Referring to FIGS. 3 and 4B, the main controller 1000C may transmit the sync signal Sync to the sensor controller 200C. The sync signal Sync may be a horizontal sync signal. However, embodiments according to the present disclosure are not limited thereto. The main controller 1000C may further transmit a vertical sync signal to the sensor controller 200C.

The sensor controller 200C may transmit the sync signal Sync to the second communication module 2420 of the input device 2000. For example, the sensor controller 200C may transmit the sync signal Sync to the second receive circuit 2421 of the second communication module 2420.

The second receive circuit 2421 of the second communication module 2420 may transmit the received sync signal Sync to the pen controller 2300. The pen controller 2300 may generate a delay signal DEL based on the sync signal Sync.

The delay signal DEL generated from the pen controller 2300 may be transmitted to the sensor controller 200C through the second communication module 2420. The sensor controller 200C may receive the delay signal DEL from the second transmit circuit 2422 of the second communication module 2420. The sensor controller 200C may identify delay information of the compensation downlink signal DLS_a in advance by means of the delay signal DEL.

Figure 5A:
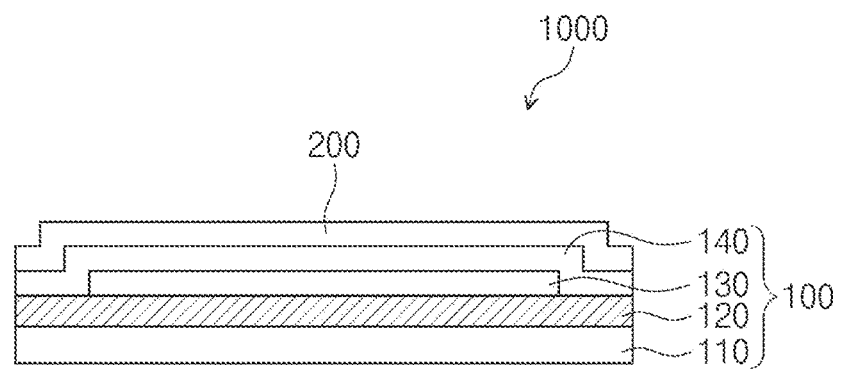
FIGS. 5A and 5B are cross-sectional views of display devices according to embodiments of the present disclosure.

FIG. 5A is a cross-sectional view of a display device according to some embodiments of the present disclosure.

Referring to FIG. 5A, a display device 1000 may include a display panel 100 and an input sensor 200. The display panel 100 may include a base layer 110, a circuit layer 120, a light emitting element layer 130, and an encapsulation layer 140.

The base layer 110 may be a member which provides a base surface on which the circuit layer 120 is located. The base layer 110 may be a glass substrate, a metal substrate, or a polymer substrate. However, embodiments according to the present disclosure are not limited thereto, and the base layer 110 may be an inorganic layer, an organic layer, or a composite material layer.

The base layer 110 may have a multi-layered structure. For example, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. Furthermore, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, the expression "~~-based resin" in the specification refers to including the functional group of "~~".

The circuit layer 120 may be located on the base layer 110. The circuit layer 120 may include an insulating layer, a semiconductor pattern, a conductive pattern, a signal line, and the like. An insulating layer, a semiconductor layer, and a conductive layer may be formed on the base layer 110 in a scheme such as coating or deposition and may then be selectively patterned through a plurality of photolithography processes. Thereafter, the semiconductor pattern, the conductive pattern, and the signal line included in the circuit layer 120 may be formed.

The light emitting element layer 130 may be located on the circuit layer 120. The light emitting element layer 130 may include a light emitting element. For example, the light emitting element layer 130 may include an organic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and foreign substances such as dust particles.

The input sensor 200 may be formed on the display panel 100 through consecutive processes. In this case, it may be represented that the input sensor 200 is directly located on the display panel 100. The expression "directly located" may mean that a third component is not located between the input sensor 200 and the display panel 100. In other words, a separate adhesive member may fail to be located between the input sensor 200 and the display panel 100. Alternatively, the input sensor 200 may be coupled to the display panel 100 by means of an adhesive member. The adhesive member may include a typical adhesive or sticking agent.

Figure 5B:
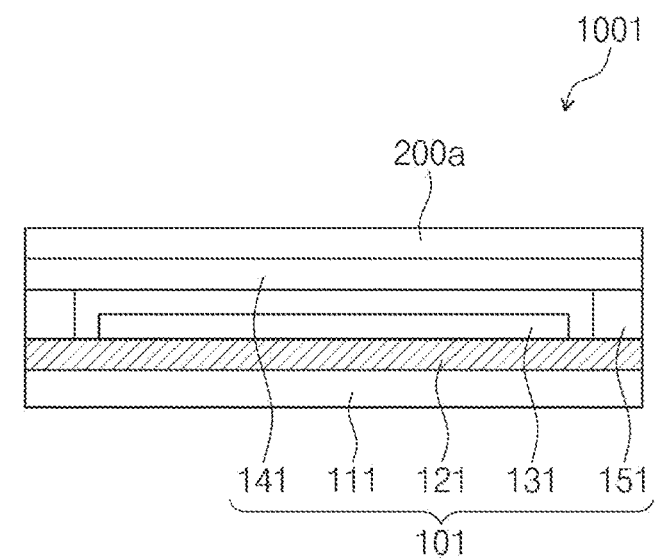

FIG. 5B is a cross-sectional view of a display device according to some embodiments of the present disclosure.

Referring to FIG. 5B, a display device 1001 may include a display panel 101 and an input sensor 200a. The display panel 101 may include a base substrate 111, a circuit layer 121, a light emitting element layer 131, an encapsulation substrate 141, and a coupling member 151.

Each of the base substrate 111 and the encapsulation substrate 141 may be, but is not particularly limited to, a glass substrate, a metal substrate, a polymer substrate, or the like.

The coupling member 151 may be located between the base substrate 111 and the encapsulation substrate 141. The coupling member 151 may couple the encapsulation substrate 141 to the base substrate 111 or the circuit layer 121. The coupling member 151 may include an inorganic material or an organic material. For example, the inorganic material may include a frit seal, and the organic material may include a photo-curable resin or a photo-plastic resin. However, a material making up the coupling member 151 is not limited to the above example.

The input sensor 200a may be directly located on the encapsulation substrate 141. The expression "directly located" may mean that a third component is not located between the input sensor 200a and the encapsulation substrate 141. In other words, a separate adhesive member may not be located between the input sensor 200a and the display panel 101. Herein, embodiments according to the present disclosure are not limited thereto, and an adhesive layer may be further located between the input sensor 200a and the encapsulation substrate 141.

Figure 6:
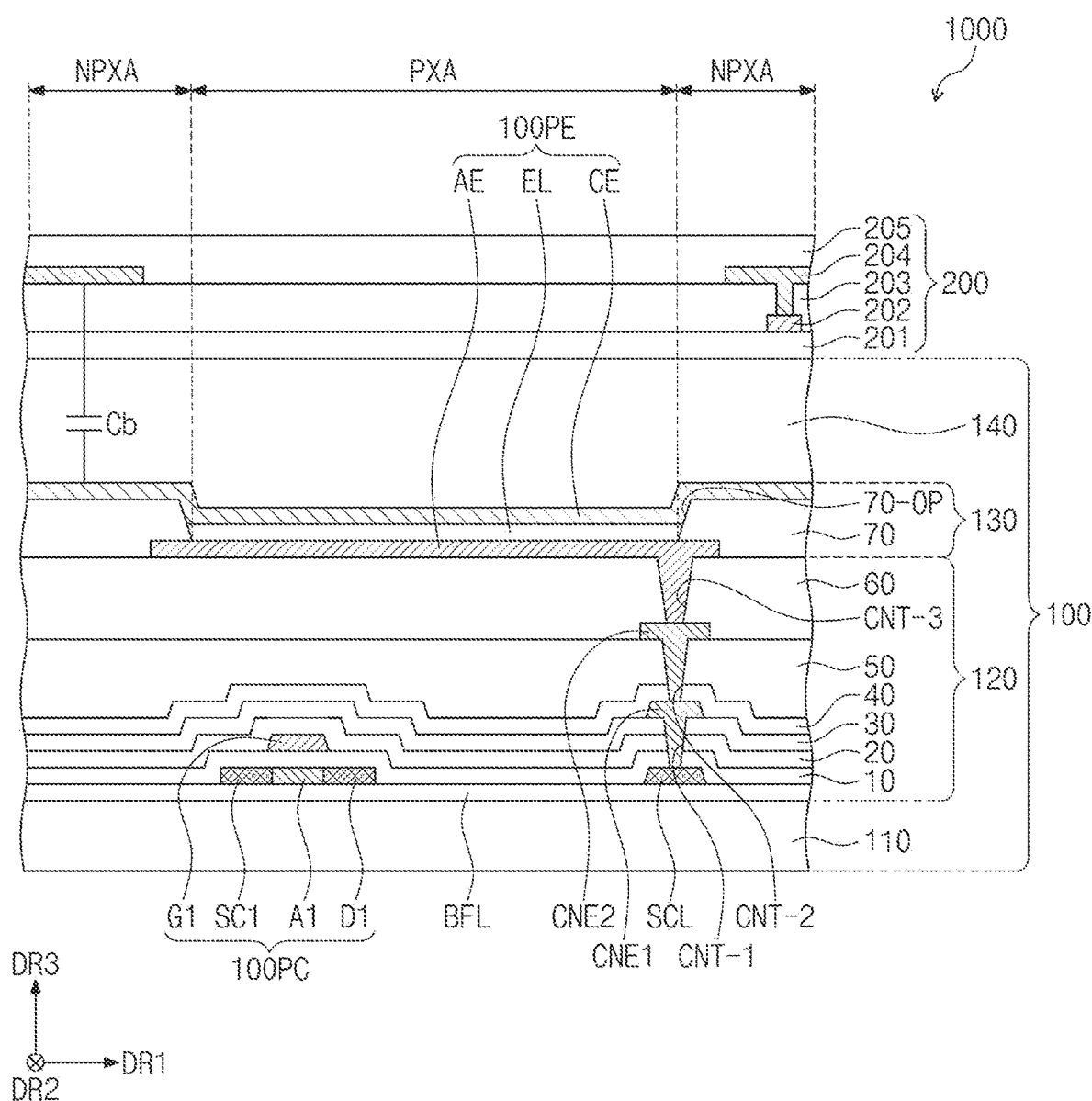
FIG. 6 is a cross-sectional view of a display device according to some embodiments of the present disclosure.

FIG. 6 is a cross-sectional view of a display device according to some embodiments of the present disclosure. In describing FIG. 6, the same reference numerals are assigned to the components described with reference to FIG. 5A, and thus some description thereof may be omitted.

Referring to FIG. 6, at least one inorganic layer may be formed on an upper surface of the base layer 110. The inorganic layer may include at least one of aluminum oxide, titanium oxide, silicon oxide, silicon oxynitride, silicon nitride, zirconium oxide, or hafnium oxide. The inorganic layer may be formed of multiple layers. The multi-layered inorganic layers may make up a barrier layer and/or a buffer layer. According to some embodiments, the display panel 100 is illustrated as including a buffer layer BFL.

The buffer layer BFL may improve a bonding force between the base layer 110 and a semiconductor pattern. The buffer layer BFL may include a silicon oxide layer and a silicon nitride layer, and the silicon oxide layer and the silicon nitride layer may be alternately laminated.

The semiconductor pattern may be located on the buffer layer BFL. The semiconductor pattern may include polysilicon. However, embodiments according to the present disclosure are not limited thereto, and the semiconductor pattern may include amorphous silicon, low-temperature polycrystalline silicon, or oxide semiconductor.

FIG. 6 only illustrates a portion of the semiconductor pattern, and the semiconductor pattern may be further located in another area. The semiconductor patterns may be arranged across pixels in a specific rule. An electrical property of the semiconductor pattern may vary depending on whether it is doped. The semiconductor pattern may include a first area having high conductivity and a second area having low conductivity. The first area may be doped with an N-type dopant or a P-type dopant. A P-type transistor may include a doping region doped with the P-type dopant, and an N-type transistor may include a doping region doped with the N-type dopant. The second area may be an undoped region or may be doped at a lower concentration than the first area.

The first area may be greater in conductivity than the second area and may substantially serve as an electrode or a signal line. The second area may substantially correspond to a channel area of a transistor. In other words, a part of the semiconductor pattern may be a channel part of a transistor, another part thereof may be a source or a drain of the transistor, and another part thereof may be a connection electrode or a connection signal line.

Each of pixels may have an equivalent circuit including seven transistors, one capacitor, and a light-emitting element, and the equivalent circuit of the pixel may be modified in various forms. One transistor 100PC and one light emitting element 100PE included in the pixel are illustrated as an example in FIG. 6.

The transistor 100PC may include a source SC1, a channel part A1, a drain D1, and a gate G1. The source SC1, the channel part A1, and the drain D1 may be formed from the semiconductor pattern. The source SC1 and the drain D1 may extend in opposite directions from the channel part A1 on the cross-section. FIG. 6 illustrates a part of a connection signal line SCL formed from the semiconductor pattern. According to some embodiments, the connection signal line SCL may be electrically connected with the drain D1 of the transistor 100PC on the plane.

A first insulating layer 10 may be located on the buffer layer BFL. The first insulating layer 10 may overlap a plurality of pixels in common and may cover the semiconductor pattern. The first insulating layer 10 may be an inorganic layer and/or an organic layer and may have a single- or multi-layered structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may be a single silicon oxide layer. As well as the first insulating layer 10, an insulating layer of the circuit layer 120 to be described below may be an inorganic layer and/or an organic layer and may have a single- or multi-layered structure. The inorganic layer may include, but is not limited to, at least one of the materials described above.

The gate G1 may be located on the first insulating layer 10. The gate G1 may be a part of a metal pattern. The gate G1 may overlap the channel part A1. The gate G1 may function as a mask in the process of doping the semiconductor pattern.

A second insulating layer 20 may be located on the first insulating layer 10 and may cover the gate G1. The second insulating layer 20 may overlap pixels in common. The second insulating layer 20 may be an inorganic layer and/or an organic layer and may have a single- or multi-layered structure. The second insulating layer 20 may include at least one of silicon oxide, silicon nitride, or silicon oxynitride. According to some embodiments, the second insulating layer 20 may have a multi-layered structure including a silicon oxide layer and a silicon nitride layer.

A third insulating layer 30 may be located on the second insulating layer 20. The third insulating layer 30 may have a single- or multi-layered structure. For example, the third insulating layer 30 may have a multi-layered structure including a silicon oxide layer and a silicon nitride layer.

A first connection electrode CNE1 may be located on the third insulating layer 30. The first connection electrode CNE1 may be connected with the connection signal line SCL through a contact hole CNT-1 penetrating the first insulating layer 10, the second insulating layer 20, and the third insulating layer 30.

A fourth insulating layer 40 may be located on the third insulating layer 30. The fourth insulating layer 40 may be a single silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected with the first connection electrode CNE1 through a contact hole CNT-2 penetrating the fourth insulating layer 40 and the fifth insulating layer 50.

A sixth insulating layer 60 may be located on the fifth insulating layer 50 and may cover the second connection electrode CNE2. The sixth insulating layer 60 may be an organic layer.

The light emitting element layer 130 may be located on the circuit layer 120. The light emitting element layer 130 may include a light emitting element 100PE. For example, the light emitting element layer 130 may include an organic light emitting material, an inorganic light emitting material, a quantum dot, a quantum rod, a micro-LED, or a nano-LED. Hereinafter, the case where the light emitting element 100PE is an organic light emitting element will be described as an example, but embodiments according to the present disclosure are not particularly limited thereto.

The light emitting element 100PE may include a first electrode AE, a light emitting layer EL, and a second electrode CE. The first electrode AE may be located on the sixth insulating layer 60. The first electrode AE may be connected with the second connection electrode CNE2 through a contact hole CNT-3 penetrating the sixth insulating layer 60.

A pixel definition layer 70 may be located on the sixth insulating layer 60 and may cover a portion of the first electrode AE. An opening 70-OP may be defined in the pixel definition layer 70. The opening 70-OP of the pixel definition layer 70 may expose at least a portion of the first electrode AE.

The active area 1000A (refer to FIG. 1) may include a light emitting area PXA and a non-light emitting area NPXA adjacent to the light emitting area PXA. The non-light emitting area NPXA may surround the light emitting area PXA. According to some embodiments, the light emitting area PXA is defined to correspond to a portion of the first electrode AE, which is exposed by the opening 70-OP.

The light emitting layer EL may be located on the first electrode AE. The light emitting layer EL may be located in an area corresponding to the opening 70-OP. In other words, the light emitting layer EL may be separately formed in each of the pixels. When the light emitting layer EL is separately formed in each of the pixels, each of the light emitting layers EL may emit light of at least one of a blue color, a red color, or a green color. However, embodiments according to the present disclosure are not limited thereto. The light emitting layer EL may be connected with the pixels to be provided in common. In this case, the light emitting layer EL may provide blue light or white light.

The second electrode CE may be located on the light emitting layer EL. The second electrode CE may be in the shape of integration and may be located in common in a plurality of pixels.

According to some embodiments, a hole control layer may be located between the first electrode AE and the light emitting layer EL. The hole control layer may be located in common in the light emitting area PXA and the non-light emitting area NPXA. The hole control layer may include a hole transport layer and may further include a hole injection layer. An electron control layer may be located between the light emitting layer EL and the second electrode CE. The electron control layer may include an electron transport layer and may further include an electron injection layer. The hole control layer and the electron control layer may be formed in common in the plurality of pixels using an open mask.

The encapsulation layer 140 may be located on the light emitting element layer 130. The encapsulation layer 140 may include an inorganic layer, an organic layer, and an inorganic layer sequentially laminated, and layers making up the encapsulation layer 140 are not limited thereto.

The inorganic layers may protect the light emitting element layer 130 from moisture and oxygen, and the organic layer may protect the light emitting element layer 130 from foreign substances such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The input sensor 200 may be formed on the display panel 100 through consecutive processes. In this case, it may be represented that the input sensor 200 is directly located on the display panel 100. The expression "directly located" may mean that a third component is not located between the input sensor 200 and the display panel 100. In other words, a separate adhesive member may fail to be located between the input sensor 200 and the display panel 100. Alternatively, the input sensor 200 may be coupled to the display panel 100 by means of an adhesive member. The adhesive member may include a typical adhesive or sticking agent.

The input sensor 200 may include a base insulating layer 201, a first conductive layer 202, a sensing insulating layer 203, a second conductive layer 204, and a cover insulating layer 205.

The base insulating layer 201 may be an inorganic layer including at least any one of silicon nitride, silicon oxynitride, and silicon oxide. Alternatively, the base insulating layer 201 may be an organic layer including an epoxy resin, an acrylic resin, or an imide-based resin. The base insulating layer 201 may have a single-layered structure or may have a multi-layered structure in which a plurality of layers is laminated along the third direction DR3.

Each of the first conductive layer 202 and the second conductive layer 204 may have a single-layered structure or may have a multi-layered structure in which a plurality of layers are laminated along the third direction DR3.

A conductive layer of a single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), or indium zinc tin oxide (IZTO). In addition, the transparent conductive layer may include conductive polymer such as PEDOT, metal nanowire, graphene, or the like.

The conductive layer of the multi-layered structure may include metal layers. The metal layers may have, for example, a three-layered structure of titanium/aluminum/titanium. The conductive layer of the multi-layered structure may include at least one metal layer and at least one transparent conductive layer.

At least any one of the sensing insulating layer 203 and the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least any one of the sensing insulating layer 203 and the cover insulating layer 205 may include an organic layer. The organic layer may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Parasitic capacitance Cb may be generated between the input sensor 200 and the second electrode CE. The closer the distance between the input sensor 200 and the second electrode CE, the more the value of the parasitic capacitance Cb may increase. The larger the parasitic capacitance Cb, the more the ratio of variation in capacitance to a reference value may decrease. The variation in the capacitance may mean a change in capacitance, which occurs before and after an input by an input means, for example, the input device 2000 (refer to FIG. 3) or the body 3000 (refer to FIG. 3) of a user.

The sensor controller 200C (refer to FIG. 3) which processes the signal sensed from the input sensor 200 may perform a leveling operation for removing a value corresponding to the parasitic capacitance Cb from the sensed signal. As the ratio of the variation in capacitance to the reference value may increase by the leveling operation, sensing sensitivity may be improved.

Figure 7:
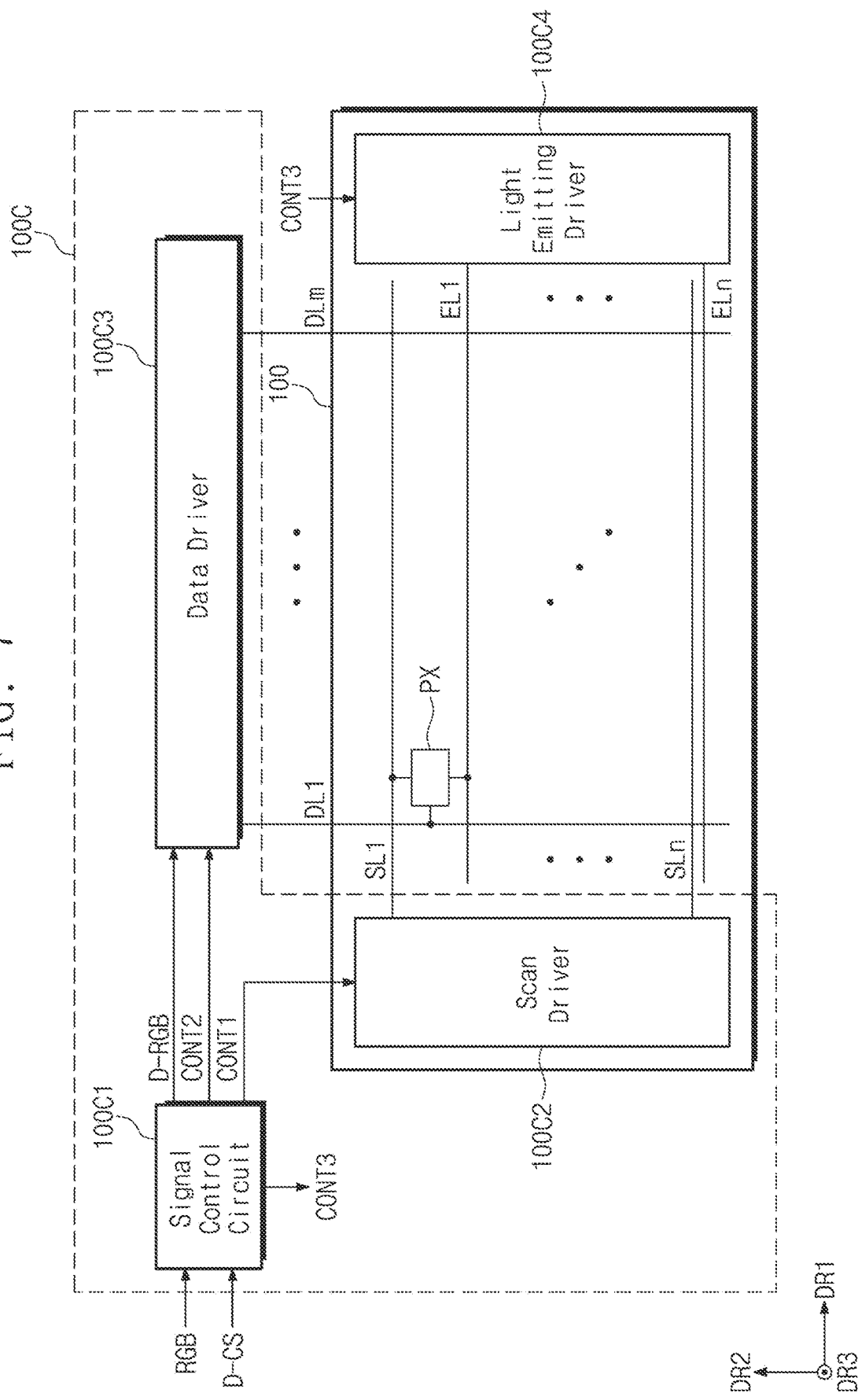
FIG. 7 is a block diagram of a display panel and a panel driver according to some embodiments of the present disclosure.

FIG. 7 is a block diagram of a display panel and a panel driver according to some embodiments of the present disclosure.

Referring to FIG. 7, the display panel 100 may include a plurality of scan lines SL1 to SLn, a plurality of data lines DL1 to DLm, a plurality of light emitting control lines EL1 to ELn, and a plurality of pixels PX. Each of the plurality of pixels PX may be connected with a corresponding data line among the plurality of data lines DL1 to DLm and may be connected with a corresponding scan line among the plurality of scan lines SL1 to SLn and a corresponding light emitting control line among the plurality of light emitting control lines EL1 to ELn.

The panel driver 100C may include a signal control circuit 100C1, a scan driver 100C2, a data driver 100C3, and a light emitting driver 100C4.

The signal control circuit 100C1 may receive an image signal RGB and a first control signal D-CS from a main controller 1000C (refer to FIG. 3). The first control signal D-CS may include various signals. For example, the first control signal D-CS may include a vertical sync signal, a horizontal sync signal Hsync (refer to FIG. 10A), a main clock, a data enable signal, and the like. The sync signal Sync illustrated in FIGS. 4A and 4B may be the horizontal sync signal Hsync.

The signal control circuit 100C1 may generate a scan control signal CONT1, a data control signal CONT2, and a light emitting control signal CONT3 based on the first control signal D-CS. The signal control circuit 100C1 may provide the scan control signal CONT1 to the scan driver 100C2, may provide the data control signal CONT2 to the data driver 100C3, and may provide the light emitting control signal CONT3 to the light emitting driver 100C4. Furthermore, the signal control circuit 100C1 may output image data D-RGB, which is obtained by processing the image signal RGB to suit an operating condition of the display panel 100, to the data driver 100C3.

The scan driver 100C2 may drive the plurality of scan lines SL1 to SLn in response to the scan control signal CONT1. The scan control signal CONT1 may include a scan start signal, a scan clock signal, or the like. According to some embodiments of the present disclosure, the scan driver 100C2 may be formed in the same process as the circuit layer 120 (refer to FIG. 6) in the display panel 100, but not limited thereto. For example, the scan driver 100C2 may be implemented as an integrated circuit (IC) to be directly mounted on a certain region of the display panel 100 or be mounted on a separate printed circuit board in a chip on film (COF) manner to be electrically connected with the display panel 100.

The data driver 100C3 may output data signals for driving the plurality of data lines DL1 to DLm in response to the data control signal CONT2 and the image data D-RGB from the signal control circuit 100C1. The data driver 100C3 may be implemented as an IC to be directly mounted on a certain region of the display panel 100 or be mounted on a separate printed circuit board in a COF manner to be electrically connected with the display panel 100, but embodiments according to the present disclosure are not particularly limited thereto. For example, the data driver 100C3 may be formed in the same process as the circuit layer 120 in the display panel 100.

The light emitting driver 100C4 may drive the plurality of light emitting control lines EL1 to ELn in response to the light emitting control signal CONT3. The light emitting control signal CONT3 may include a light emitting start signal, a light emitting clock signal, or the like. According to some embodiments of the present disclosure, the light emitting driver 100C4 may be formed in the same process as the circuit layer 120 in the display panel 100, but not limited thereto. For example, the light emitting driver 100C4 may be implemented as an integrated circuit (IC) to be directly mounted on a certain region of the display panel 100 or be mounted on a separate printed circuit board in a chip on film (COF) manner to be electrically connected with the display panel 100.

According to some embodiments of the present disclosure, the light emitting driver 100C4 may have a component independent of the scan driver 100C2, but the present disclosure is not limited thereto. For example, the scan driver 100C2 and the light emitting driver 100C4 may be implemented into one integrated circuit.

Figure 8:
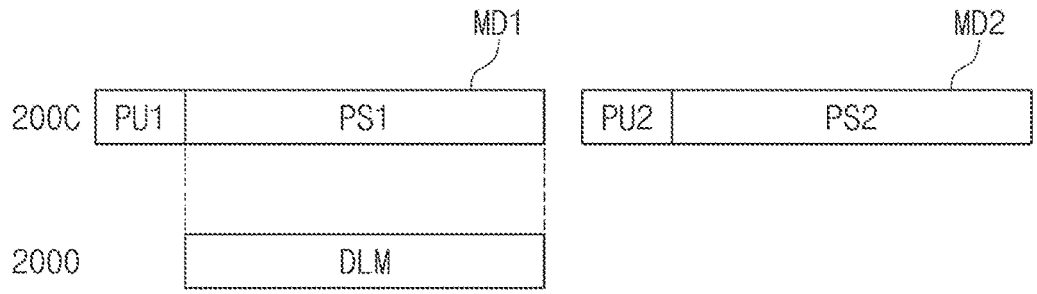
FIG. 8 is a conceptual diagram illustrating operations of a first mode and a second mode according to some embodiments of the present disclosure.

FIG. 8 is a conceptual diagram illustrating operations of a first mode and a second mode according to some embodiments of the present disclosure.

Referring to FIGS. 3 and 8, the sensor controller 200C may operate in a first mode MD1 for detecting a first input by the input device 2000 or a second mode MD2 for detecting a second input by the body 3000 of the user.

The first mode MD1 may include a first period PU1 and a second period PS1. The second period PS1 may proceed after the first period PU1. The first period PU1 may be an uplink period where the uplink signal ULS is able to be transmitted to the input sensor 200. The second period PS1 may be a downlink period where the compensation downlink signal DLS_a provided from the input device 2000 is able to be received through the input sensor 200. The input sensor 200 may sense the first input of the input device 2000 based on the compensation downlink signal DLS_a. The input device 2000 may provide the compensation downlink signal DLS_a to the sensor controller 200C during the downlink period DLM.

The sensor controller 200C may operate in the second mode MD2, after the first mode MD1 is ended. The first mode MD1 and the second mode MD2 may be repeated with each other.

The second mode MD2 may include a first period PU2 and a second period PS2. The second period PS2 may proceed after the first period PU2. The first period PU2 may be an uplink period where the uplink signal ULS is able to be transmitted to the input sensor 200. The second period PS2 may be a period where the second input is detected by the body 3000 of the user.

The input device 2000 may provide the input sensor 200 with a response signal to the uplink signal ULS. When receiving the response signal sensed by the input sensor 200 in the first period PU1 or PU2, the sensor controller 200C may operate in the second period PS1 of the first mode MD1. When not receiving the response signal from the input device 2000 in the first period PU2, the sensor controller 200C may operate in the second period PS2 of the second mode MD2. Thus, the input sensor 200 may periodically monitor whether or not there is sensing of the input device 2000 and may easily sense the first input by the input device 2000. However, this is merely illustrative, and the operation of the sensor controller 200C is not particularly limited thereto.

Figure 9:
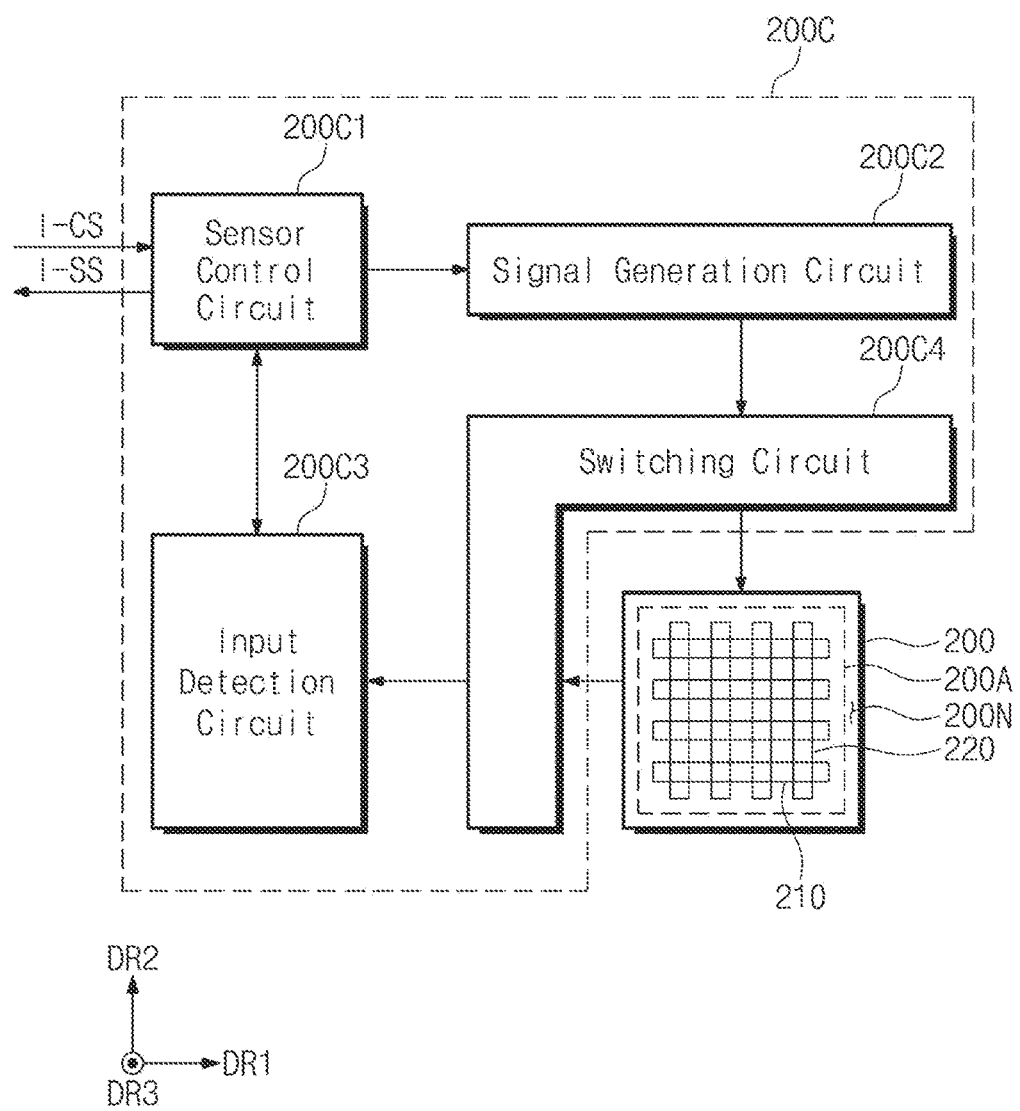
FIG. 9 is a block diagram of an input sensor and a sensor controller according to some embodiments of the present disclosure.

FIG. 9 is a block diagram of an input sensor and a sensor controller according to some embodiments of the present disclosure.

Referring to FIG. 9, a sensing area 200A and a non-sensing area 200N may be defined in an input sensor 200. The sensing area 200A may be an area which is activated according to an electrical signal. For example, the sensing area 200A may be an area where an input is sensed. The sensing area 200A may overlap the active area 1000A (refer to FIG. 1) of a display device 1000 (refer to FIG. 1). The non-sensing area 200N may surround the sensing area 200A. The non-sensing area 200N may overlap the non-active area 1000NA (refer to FIG. 1) of the display device 1000 (refer to FIG. 1).

The input sensor 200 may include a plurality of first sensing electrodes 210 and a plurality of second sensing electrodes 220. Each of the plurality of first sensing electrodes 210 may extend along a first direction DR1, and the plurality of first sensing electrodes 210 may be arranged spaced apart from each other in a second direction DR2. Each of the plurality of second sensing electrodes 220 may extend along the second direction DR2, and the plurality of second sensing electrodes 220 may be arranged spaced apart from each other in the first direction DR1.

The plurality of second sensing electrodes 220 and the plurality of first sensing electrodes 210 may cross each other to be insulated from each other. Each of the plurality of first sensing electrodes 210 and the plurality of second sensing electrodes 220 may have a bar shape or a stripe shape. The plurality of first sensing electrodes 210 and the plurality of second sensing electrodes 220, each of which has such a shape, may improve sensing characteristics of consecutive linear inputs. However, the shape of each of the plurality of first sensing electrodes 210 and the plurality of second sensing electrodes 220 is not limited thereto.

The sensor controller 200C may receive the second control signal I-CS from the main controller 1000C (refer to FIG. 3) and may provide the coordinate signal I-SS to the main controller 1000C.

The sensor controller 200C may include a sensor control circuit 200C1, a signal generation circuit 200C2, an input detection circuit 200C3, and a switching circuit 200C4. The sensor control circuit 200C1, the signal generation circuit 200C2, and the input detection circuit 200C3 may be implemented in a single chip, or some of the sensor control circuit 200C1, the signal generation circuit 200C2, and the input detection circuit 200C3 and the others may be implemented in different chips.

The sensor control circuit 200C1 may control operations of the signal generation circuit 200C2 and the switching circuit 200C4 and may calculate coordinates of an external input from a driving signal received from the input detection circuit 200C3 or may analyze information, transmitted from the input device 2000 (refer to FIG. 3), from a modulation signal received from the input detection circuit 200C3.

The signal generation circuit 200C2 may provide the input sensor 200 with an output signal called a transmit signal. The signal generation circuit 200C2 may output an output signal matched with an operation mode to the input sensor 200.

The input detection circuit 200C3 may convert an analog type of receive signal (or sensing signal) received from the input sensor 200 into a digital signal. The input detection circuit 200C3 may amplify and filter the receive signal. The input detection circuit 200C3 may convert the subsequently filtered signal into a digital signal.

The switching circuit 200C4 may selectively control an electrical connection relationship between the input sensor 200 and the signal generation circuit 200C2 and/or the input detection circuit 200C3 under control of the sensor control circuit 200C1. The switching circuit 200C4 may connect any one group among the plurality of first sensing electrodes 210 and the plurality of second sensing electrodes 220 with the signal generation circuit 200C2 or may connect each of the plurality of first sensing electrodes 210 and the plurality of second sensing electrodes 220 with the signal generation circuit 200C2, under control of the sensor control circuit 200C1. Alternatively, the switching circuit 200C4 may connect one group or all of the plurality of first sensing electrodes 210 and the plurality of second sensing electrodes 220 with the input detection circuit 200C3.

Figure 10A:
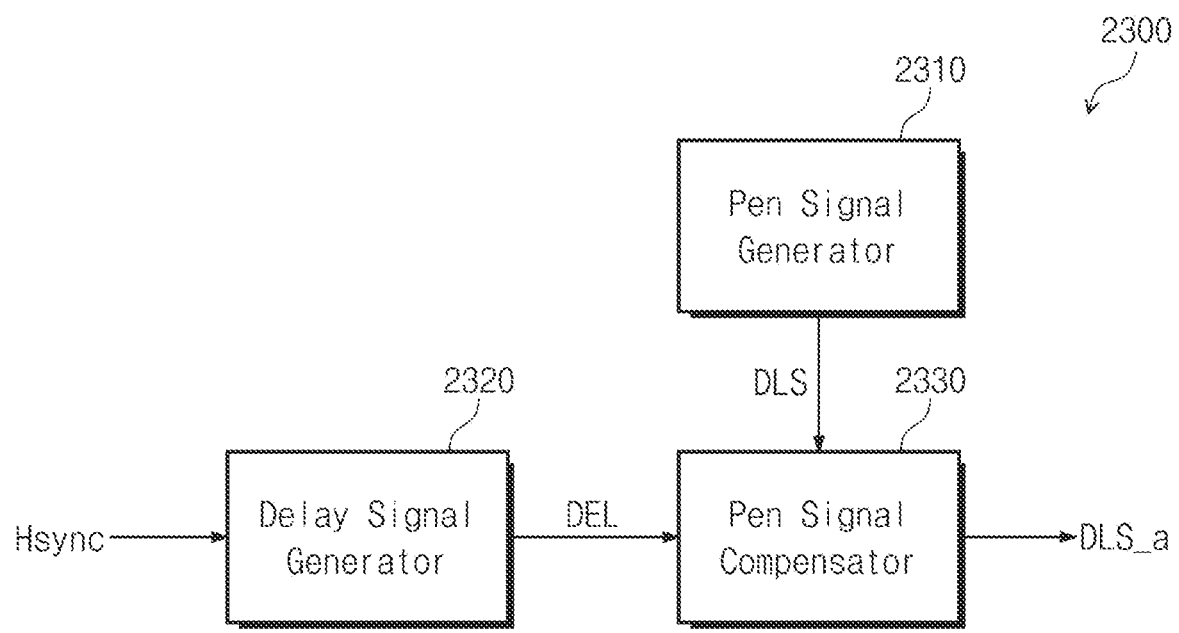
FIG. 10A is a block diagram of a pen controller according to some embodiments of the present disclosure.
Figure 10B:
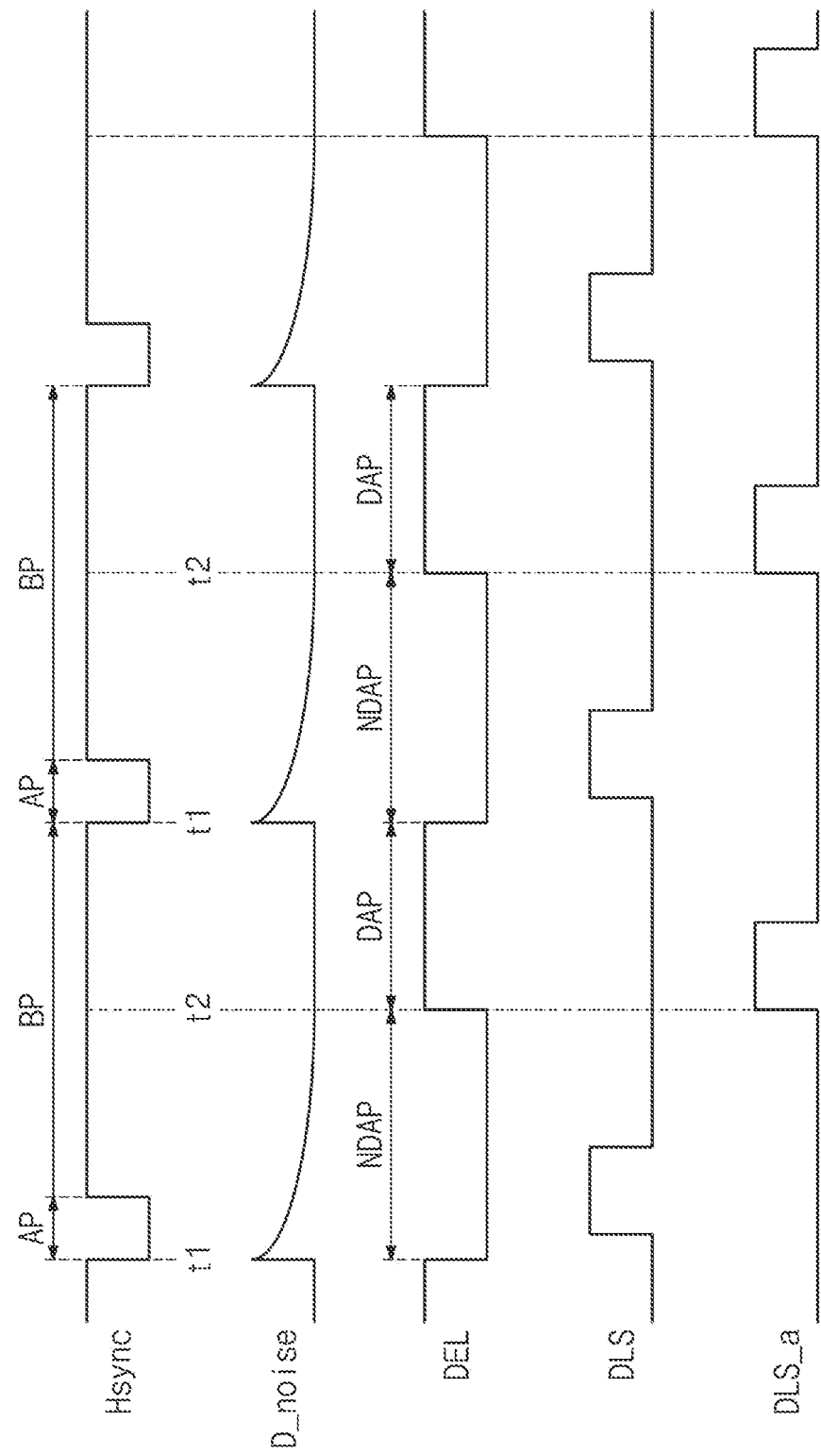
FIGS. 10B and 10C are waveform diagrams for describing an operation of a pen controller illustrated in FIG. 10A.
Figure 10C:
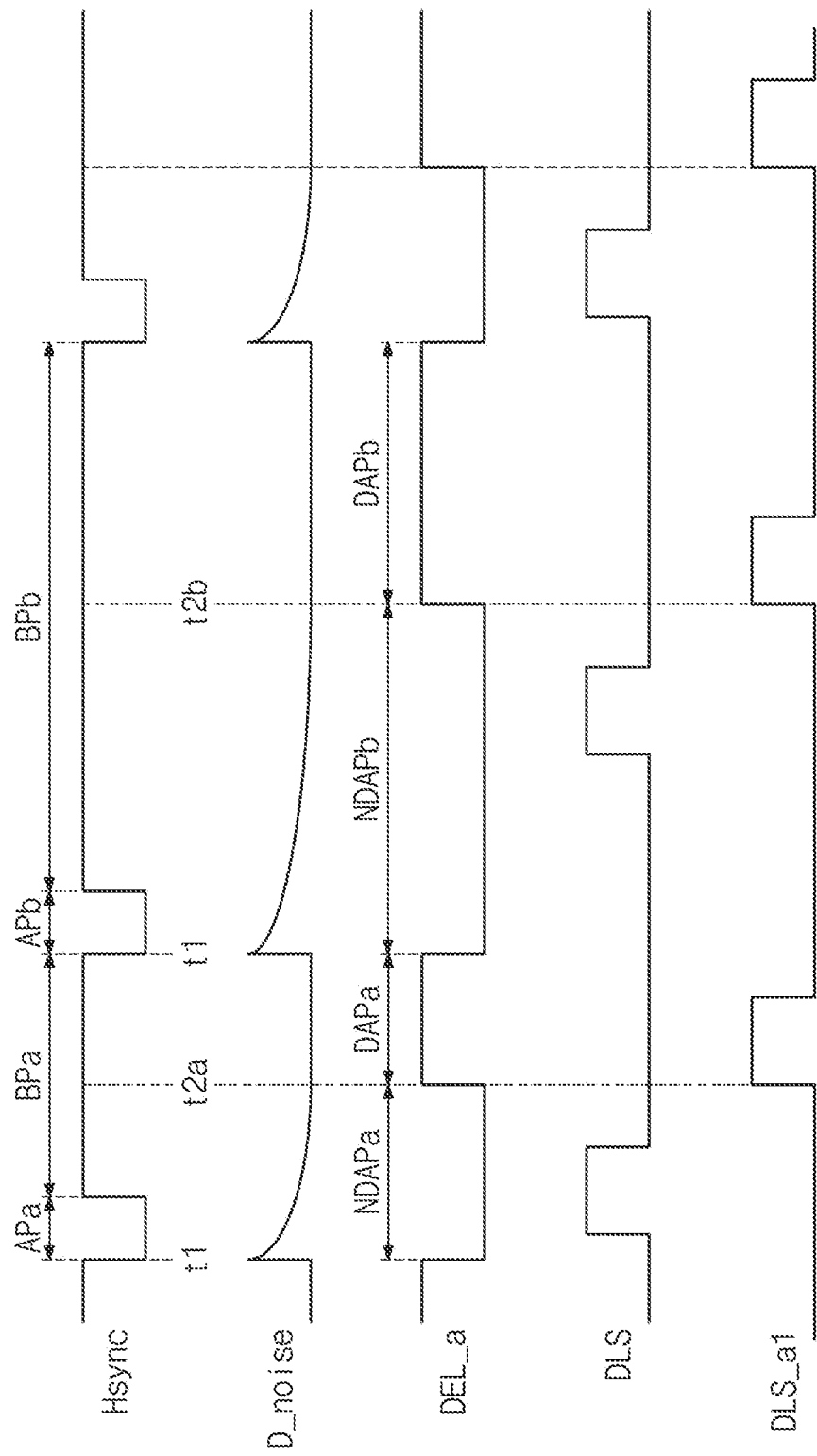

FIG. 10A is a block diagram of a pen controller according to some embodiments of the present disclosure. FIGS. 10B and 10C are waveform diagrams for describing an operation of a pen controller illustrated in FIG. 10A.

Referring to FIGS. 10A and 10B, a pen controller 2300 may include a pen signal generator 2310, a delay signal generator 2320, a pen signal compensator 2330.

The pen signal generator 2310 may generate a downlink signal DLS including state information of the input device 2000 (refer to FIG. 3). For example, the state information may include coordinate information of the input device 2000, battery information of the input device 2000, slope information of the input device 2000, various pieces of information stored in the input device 2000, and/or the like.

The delay signal generator 2320 may receive the sync signal Sync (refer to FIG. 4A) from the second communication module 2420 (refer to FIG. 4A). As an example of the present disclosure, the sync signal Sync may include a horizontal sync signal Hsync. The delay signal generator 2320 may generate a delay signal DEL based on the sync signal Sync (e.g., the horizontal sync signal Hsync). As illustrated in FIG. 10B, the horizontal sync signal Hsync may include an activation period (or a data write period) AP and a blank period BP.

The delay signal DEL may be a signal activated at a time point (i.e., a second time point t2) delayed by a reference time (e.g., a set or predetermined reference time) from a start time point (i.e., a first time point t1) of the activation period AP of the horizontal sync signal Hsync. In other words, the delay signal DEL may include a deactivation period NDAP deactivated from the first time point t1 to the second time point t2 and a delay activation period DAP activated from the second time point t2. A data driver 100C3 (refer to FIG. 7) may output a data signal to the display panel 100 during the activation period AP of the horizontal sync signal Hsync. Thus, when the activation period AP is initiated, display noise D_noise generated in the display device 1000 (refer to FIG. 3) may increase in magnitude. Herein, the deactivation period NDAP may be set in response to a period (i.e., a display noise period) in which the display noise D_noise appears.

The pen signal compensator 2330 may receive the delay signal DEL from the delay signal generator 2320 and may receive the downlink signal DLS from the pen signal compensator 2330. The pen signal compensator 2330 may compensate for the downlink signal DLS based on the delay signal DEL. The pen signal compensator 2330 may delay the downlink signal DLS based on the delay signal DEL to generate the compensation downlink signal DLS_a.

For example, the driving period of the downlink signal DLS may overlap the display noise period. However, when the driving period of the downlink signal DLS overlaps the display noise period, it may be difficult for the display device 1000 to normally sense the downlink signal DLS transmitted from the input device 2000 due to the display noise. The pen signal compensator 2330 may compensate for the compensation downlink signal DLS_a having the driving period which does not overlap the display noise period. In other words, the driving period of the compensation downlink signal DLS_a may overlap the delay activation period DAP and may fail to overlap the deactivation period NDAP. As an example of the present disclosure, the driving period of the compensation downlink signal DLS_a may be located within the delay activation period DAP.

The second time point t2 may be a time point when the display noise D_noise is reduced. The second time point t2 may vary with a driving frequency of the display device 1000. In other words, a duration of the deactivation period NDAP of the delay signal DEL may vary with the driving frequency of the display device 1000.

As illustrated in FIG. 10C, the period of the horizontal sync signal Hsync may vary with the driving frequency of the display device 1000 (refer to FIG. 3). The horizontal sync signal Hsync may include a first activation period APa and a first blank period BPa at a first driving frequency. The horizontal sync signal Hsync may include a second activation period APb and a second blank period BPb at a second driving frequency. When the second driving frequency is lower than the first driving frequency, the duration of the second activation period APb may be the same as the duration of the first activation period APa, but the duration of the second blank period BPb may be greater than the duration of the first blank period BPa.

As such, when the driving frequency varies, a reference time may vary by interworking with the driving frequency. In other words, the delay signal DEL_a generated by the delay signal generator 2320 may be activated at a third time point t2a delayed by a first reference time from the first time point t1 at the first driving frequency. Furthermore, the delay signal DEL_a may be activated at a fourth time point t2b delayed by a second reference time from the first time point t1 at the second driving frequency. When the second driving frequency is lower than the first driving frequency, the second reference time may be longer than the first reference time.

The delay signal DEL_a may include a first deactivation period NDAPa and a first delay activation period DAPa at the first driving frequency and may include a second deactivation period NDAPb and a second delay activation period DAPb at the second driving frequency. As an example of the present disclosure, the duration of the second deactivation period NDAPb may be equal to or greater than the duration of the first deactivation period NDAPa.

The pen signal compensator 2330 may generate a compensation downlink signal DLS_a1 having a driving period which does not overlap the display noise period. In other words, the driving period of the compensation downlink signal DLS_a1 may overlap the first delay activation period DAPa or the second delay activation period DAPb and may fail to overlap the first and second deactivation periods NDAPa and NDAPb. As an example of the present disclosure, the driving period of the compensation downlink signal DLS_a1 may be located within the first delay activation period DAPa or the second delay activation period DAPb.

As such, when delaying the driving period of the downlink signal DLS based on the horizontal sync signal to generate the compensation downlink signal DLS_a or DLS_a1, the pen signal compensator 2330 may avoid the display noise period to transmit the compensation downlink signal DLS_a or DLS_a1 to the display device 1000 (refer to FIG. 3). Thus, the display device 1000 may normally sense the compensation downlink signal DLS_a or DLS_a1 transmitted from the input device 2000 without interference of display noise. As a result, the sensing sensitivity of the display device 1000 may be improved.

Furthermore, as an example of the present disclosure, each of the downlink signal DLS and the compensation downlink signal DLS_a or DLS_a1 may be a signal having a square wave. When each of the downlink signal DLS and the compensation downlink signal DLS_a or DLS_a1 is the signal having the square wave rather than a sine wave, circuits necessary in the sensor controller 200C to process the compensation downlink signal DLS_a or DLS_a1 may be simplified. For example, the sensor controller 200C should be able to have a demodulation circuit for demodulation to process a downlink signal having a sine wave. However, when the compensation downlink signal DLS_a or DLS_a1 is the signal having the square wave, the sensor controller 200C may fail to additionally require a demodulation circuit. As a result, the circuit configuration of the sensor controller 200C may be simplified.

Figure 11A:
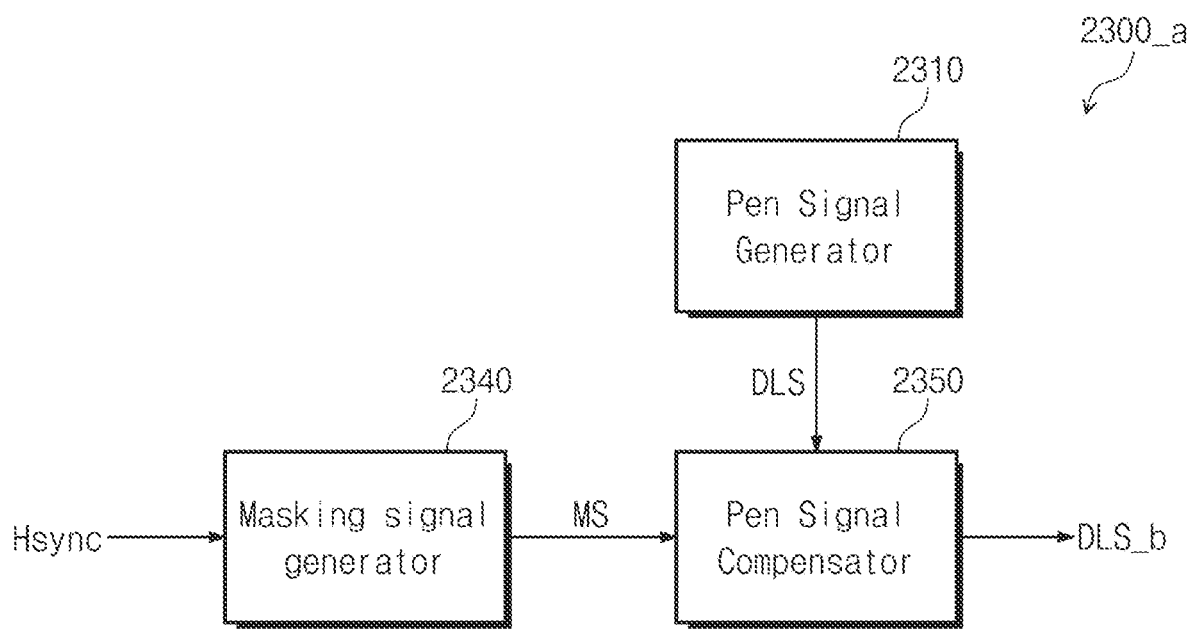
FIG. 11A is a block diagram of a pen controller according to some embodiments of the present disclosure.
Figure 11B:
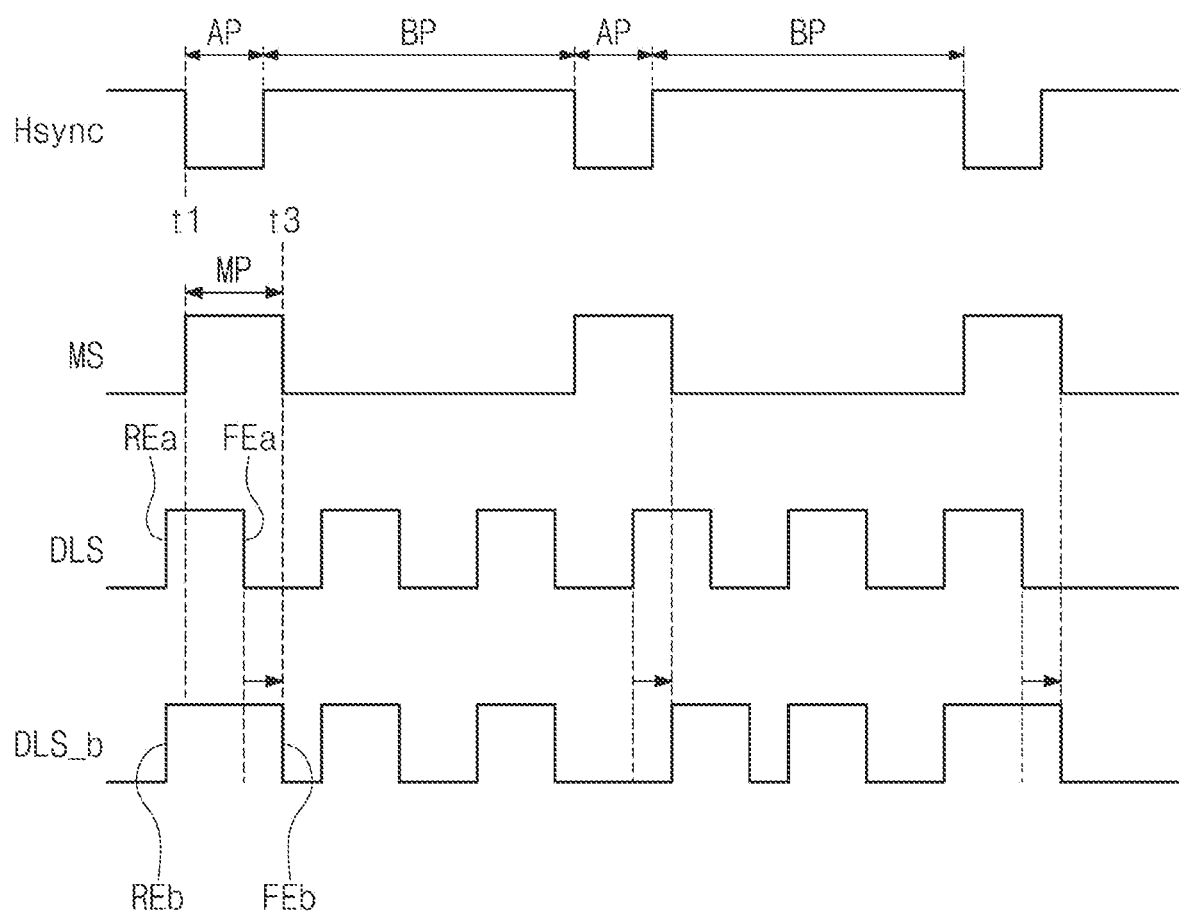
FIG. 11B is a waveform diagram for describing an operation of a pen controller illustrated in FIG. 11A.

FIG. 11A is a block diagram of a pen controller according to some embodiments of the present disclosure. FIGS. 11B and 11C are waveform diagrams for describing an operation of a pen controller illustrated in FIG. 11A.

Referring to FIGS. 11A and 11B, a pen controller 2300_a may include a pen signal generator 2310, a masking signal generator 2340, a pen signal compensator 2350.

The masking signal generator 2340 may receive a sync signal Sync (refer to FIG. 4A) from a second communication module 2420 (refer to FIG. 4A). As an example of the present disclosure, the sync signal Sync may include a horizontal sync signal Hsync. The masking signal generator 2340 may generate a masking signal MS based on the sync signal Sync (e.g., the horizontal sync signal Hsync). As illustrated in FIG. 11B, the horizontal sync signal Hsync may include an activation period (or a data write period) AP and a blank period BP. The masking signal MS may include a masking period MP set from a start time point (i.e., a first time point t1) of the activation period AP of the horizontal sync signal Hsync to a reference time point (e.g., a set or predetermined reference time point) t3. In other words, the masking period MP may be a period which is activated from the first time point t1 to the reference time point t3. The masking period MP may overlap the activation period AP and a duration of the masking period MP may be greater than a duration of the activation period AP.

The pen signal compensator 2350 may receive the masking signal MS from the masking signal generator 2340 and may receive the downlink signal DLS from the pen signal generator 2310. The pen signal compensator 2350 may compensate for the downlink signal DLS based on the masking signal MS. The pen signal compensator 2350 may generate a compensation downlink signal DLS_b compensated from the downlink signal DLS based on the masking signal MS.

For example, some of falling edges FEa and rising edges REa of the downlink signal DLS may be arranged by overlapping the activation period AP of the horizontal sync signal Hsync. However, when the falling edges FEa and rising edges REa of the downlink signal DLS overlap the activation period AP, it may be difficult for the display device 1000 (refer to FIG. 3) to normally sense the downlink signal DLS transmitted from an input device 2000 (refer to FIG. 3) due to display noise. Thus, the pen signal compensator 2350 may generate the compensation downlink signal DLS_b having falling edges FEb and rising edges REb, which do not overlap the activation period AP.

The pen signal compensator 2350 may delay falling edges FEb and rising edges REb, which overlap the activation period AP, such that the compensation downlink signal DLS_b rises or falls at a position where the falling edges FEb and the rising edges REb do not overlap the activation period AP. In other words, the falling edge FEb and the rising edge REb of the driving period of the compensation downlink signal DLS_b may fail to overlap the activation period AP. As an example of the present disclosure, the falling edge FEb and/or the rising edge REb of the driving period of the compensation downlink signal DLS_b may be delayed up to a time point when the masking period MP of the masking signal MS is ended.

As such, as the falling edge FEb and/or the rising edge REb of the compensation downlink signal DLS_b is delayed, a duration of the driving period of the compensation downlink signal DLS_b may fail to be constant. In other words, the duration of the driving period of the downlink signal DLS may be constant, whereas the duration of the driving period of the compensation downlink signal DLS_b may fail to be constant.

When delaying the falling edges FEa and/or the rising edges REa of the downlink signal DLS based on the horizontal sync signal Hsync to generate the compensation downlink signal DLS_b, the pen signal compensator 2350 may avoid display noise to transmit the compensation downlink signal DLS_b to the display device 1000. Thus, the display device 1000 may normally sense the compensation downlink signal DLS_b transmitted from the input device 2000 without interference of display noise. As a result, the sensing sensitivity of the display device 1000 may be improved.

According to some embodiments of the present disclosure, as a sync signal used in a display device is transmitted to an input device, the input device may avoid a display noise period to transmit a signal to the display device. Thus, the display device may normally sense the signal transmitted from the input device without interference of display noise. As a result, the sensing sensitivity of the electronic device may be improved.

Furthermore, the signal transmitted from the input device to the display device may have a square wave which does not require a demodulation circuit. As a result, the circuit configuration of a sensor controller may be simplified.

While aspects of some embodiments of the present disclosure have been described with reference to some embodiments thereof, it will be apparent to those of ordinary skill in the art that various changes and modifications may be made thereto without departing from the spirit and scope of embodiments according to the present disclosure as set forth in the following claims. Accordingly, the technical scope of the present disclosure should not be limited to the contents described in the detailed description of the specification, but should be defined by the claims, and their equivalents.

What is claimed is:

1. An electronic device, comprising:
    a display device configured to display an image; and
    an input device configured to communicate with the display device,
    wherein the display device includes:
        a display panel including a plurality of pixels;
        an input sensor on the display panel;
        a panel driver configured to control the display panel;
        a main controller configured to provide a control signal to the panel driver; and
        a sensor controller configured to control the input sensor,
    wherein the control signal includes:
        a vertical sync signal for determining a frame period where the image is displayed; and
        a horizontal sync signal signal for determining a time point when data is written in the plurality of pixels, and
    wherein the main controller is configured to transmit at least one of the vertical sync signal or the horizontal sync signal as a sync signal to the input device, or the sensor controller is configured to receive at least one of the vertical sync signal or the horizontal sync signal and to transmit the received at least one of the vertical sync signal or the horizontal sync signal to the input device.

2. The electronic device of claim 1, wherein
    the sync signal includes the horizontal sync signal.

3. The electronic device of claim 1, wherein the input sensor is configured to operate in a first mode for detecting a first input by an input device or to operate in a second mode for detecting a second input different from the first input.

4. The electronic device of claim 3, wherein the input device includes:
    a first communication module configured to receive an uplink signal from the input sensor in the first mode and to transmit a compensation downlink signal to the input sensor; and
    a second communication module configured to receive the sync signal.

5. The electronic device of claim 4, wherein the second communication module is configured to communicate with the display device over a short range communication network.

6. The electronic device of claim 4, wherein the input device further includes:
    a pen controller connected with the first communication module and the second communication module, and
    wherein the pen controller includes:
    a pen signal generator configured to generate a downlink signal;
    a delay signal generator configured to generate a delay signal based on the sync signal; and
    a pen signal compensator configured to generate the compensation downlink signal based on the delay signal and the downlink signal, and
    wherein a delay activation period of the delay signal does not overlap an activation period of the sync signal.

7. The electronic device of claim 6, wherein the delay activation period is initiated at a time point delayed by a predetermined reference time from a start time point of the activation period of the sync signal.

8. The electronic device of claim 7, wherein the sync signal further includes a blank period, and
    wherein a driving period of the compensation downlink signal is generated within the delay activation period of the delay signal to overlap the blank period of the sync signal.

9. The electronic device of claim 7, wherein the reference time varies with a driving frequency of the display device.

10. The electronic device of claim 6, wherein each of the downlink signal and the compensation downlink signal have a square wave.

11. The electronic device of claim 4, wherein the input device further includes a pen controller connected with the first communication module and the second communication module, and comprising:
    a pen signal generator configured to generate a downlink signal;
    a masking signal generator configured to generate a masking signal based on the sync signal; and
    a pen signal compensator configured to generate the compensation downlink signal based on the masking signal and the downlink signal.

12. The electronic device of claim 11, wherein a masking period of the masking signal overlap an activation period of the sync signal.

13. The electronic device of claim 12, wherein the masking period is set to a period from a start time point of the activation period of the sync signal to a predetermined reference time point, and
wherein a falling edge and a rising edge of the compensation downlink signal do not overlap the activation period.

14. The electronic device of claim 12, wherein the masking period is greater in duration than the activation period.

15. The electronic device of claim 4, wherein the second communication module is configured to transmit delay information of the compensation downlink signal to the sensor controller.

16. The electronic device of claim 1, wherein the input sensor comprises first sensing electrodes, and second sensing electrodes crossing the first sensing electrodes to be insulated from the first sensing electrodes.

17. The electronic device of claim 1, wherein the display panel includes:
a light emitting element layer including a light emitting element; and
an encapsulation layer on the light emitting element layer.

18. The electronic device of claim 17 wherein the input sensor is directly on the encapsulation layer.

* * * * *